United States Patent
Lee et al.

(10) Patent No.: US 12,044,736 B2
(45) Date of Patent: Jul. 23, 2024

(54) VIBRATION TEST JIG AND VIBRATION TEST APPARATUS FOR CYLINDRICAL BATTERY CELL

(71) Applicant: LG ENERGY SOLUTION, LTD., Seoul (KR)

(72) Inventors: Ik Jong Lee, Daejeon (KR); Duk Hyun Ryu, Daejeon (KR); Jung Hoon Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/767,639

(22) PCT Filed: Nov. 12, 2020

(86) PCT No.: PCT/KR2020/015837
§ 371 (c)(1),
(2) Date: Apr. 8, 2022

(87) PCT Pub. No.: WO2021/112430
PCT Pub. Date: Jun. 10, 2021

(65) Prior Publication Data
US 2024/0103082 A1    Mar. 28, 2024

(30) Foreign Application Priority Data
Dec. 4, 2019   (KR) .................. 10-2019-0159566

(51) Int. Cl.
*G01R 31/385* (2019.01)
*G01R 31/36* (2020.01)
*G01R 31/389* (2019.01)

(52) U.S. Cl.
CPC ....... *G01R 31/3644* (2013.01); *G01R 31/385* (2019.01); *G01R 31/389* (2019.01)

(58) Field of Classification Search
CPC ............ G01R 31/3644; G01R 31/396; G01R 31/385; G01R 1/0408; G01R 31/389;
(Continued)

(56) References Cited

U.S. PATENT DOCUMENTS

| 7,179,181 B2* | 2/2007 | Ko ................... A63B 41/00 473/570 |
| 10,330,565 B2* | 6/2019 | Lee .................... B60L 3/12 |

(Continued)

FOREIGN PATENT DOCUMENTS

| CN | 204885368 U | 12/2015 |
| CN | 109238610 A | 1/2019 |

(Continued)

OTHER PUBLICATIONS

Extended European Search Report dated Sep. 27, 2023, issued in corresponding European Patent Application No. 20897018.6.
(Continued)

*Primary Examiner* — Vinh p Nguyen
(74) *Attorney, Agent, or Firm* — Morgan, Lewis & Bockius LLP

(57) ABSTRACT

The present invention relates to a vibration test jig for a cylindrical battery cell, including: a main body for accommodating a cylindrical battery cell; and a connection unit electrically connected to an electrode terminal of the cylindrical battery cell, wherein the connection unit includes: a connection member electrically connected to the electrode terminal and withdrawn to the outside of the main body; a support member for supporting the connection member; and a fixing member for fixing the support member on the main
(Continued)

body. The vibration test jig enables the cylindrical battery cell mounted in the jig to be electrically connected to an external voltage and resistance measuring device through the connection unit. During a vibration test, an electrical state of the battery cell can be monitored in real time, and it can be checked whether and when an electrode tab is disconnected by using the measured voltage or resistance value.

11 Claims, 8 Drawing Sheets

(58) Field of Classification Search
CPC .. G01R 31/54; G01M 7/027; H01M 10/4285; H01M 10/0422
See application file for complete search history.

(56) References Cited

U.S. PATENT DOCUMENTS

| | | | |
|---|---|---|---|
| 10,629,966 B2 * | 4/2020 | Biswas | H01M 50/213 |
| 2009/0208835 A1 | 8/2009 | Horiuchi et al. | |
| 2018/0366788 A1 | 12/2018 | Lee et al. | |

FOREIGN PATENT DOCUMENTS

| | | | |
|---|---|---|---|
| CN | 110220660 A | | 9/2019 |
| JP | 4452450 B2 | | 4/2010 |
| JP | 5645772 B2 | | 12/2014 |
| JP | 2018-137161 A | | 8/2018 |
| KR | 10-0619327 B1 | | 9/2006 |
| KR | 10-2009-0088331 A | | 8/2009 |
| KR | 10-2012-0075327 A | | 7/2012 |
| KR | 10-1204165 B1 | | 11/2012 |
| KR | 10-2013-0063207 A | | 6/2013 |
| KR | 10-1395847 B1 | | 5/2014 |
| KR | 10-2016-0072572 A | | 6/2016 |
| KR | 10-2017-0090726 A | | 8/2017 |
| KR | 10-1858393 B1 | | 5/2018 |
| KR | 10-1949106 B1 | | 2/2019 |
| KR | 101949106 | * | 2/2019 |
| KR | 10-1961877 B1 | | 3/2019 |
| KR | 10-2000283 B1 | | 7/2019 |

OTHER PUBLICATIONS

International Search Report (with partial translation) and Written Opinion dated Mar. 3, 2021 issued in corresponding International Patent Application No. PCT/KR2020/015837.

* cited by examiner

[FIG. 1]
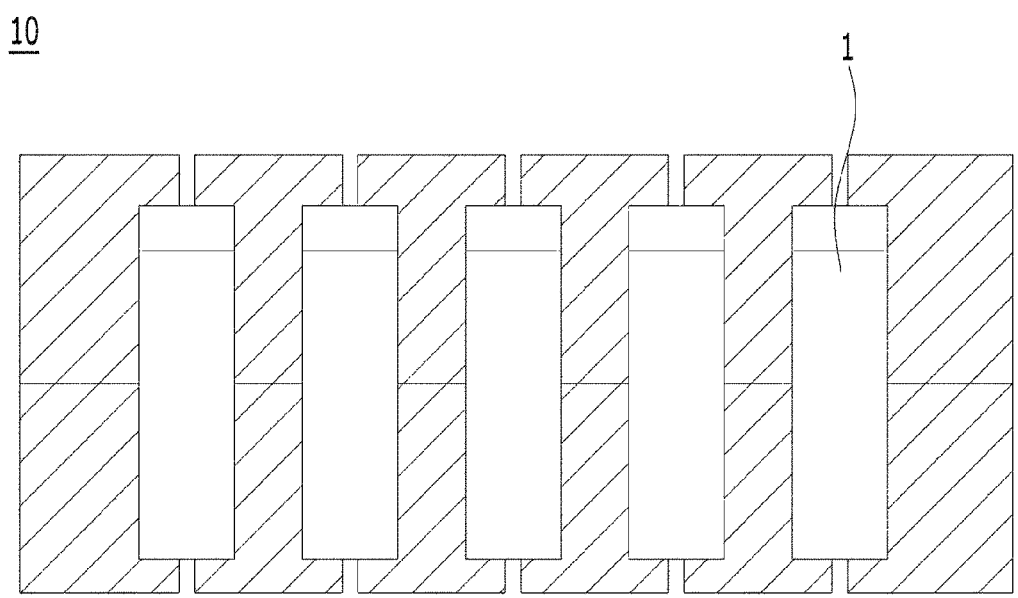

[FIG. 2]
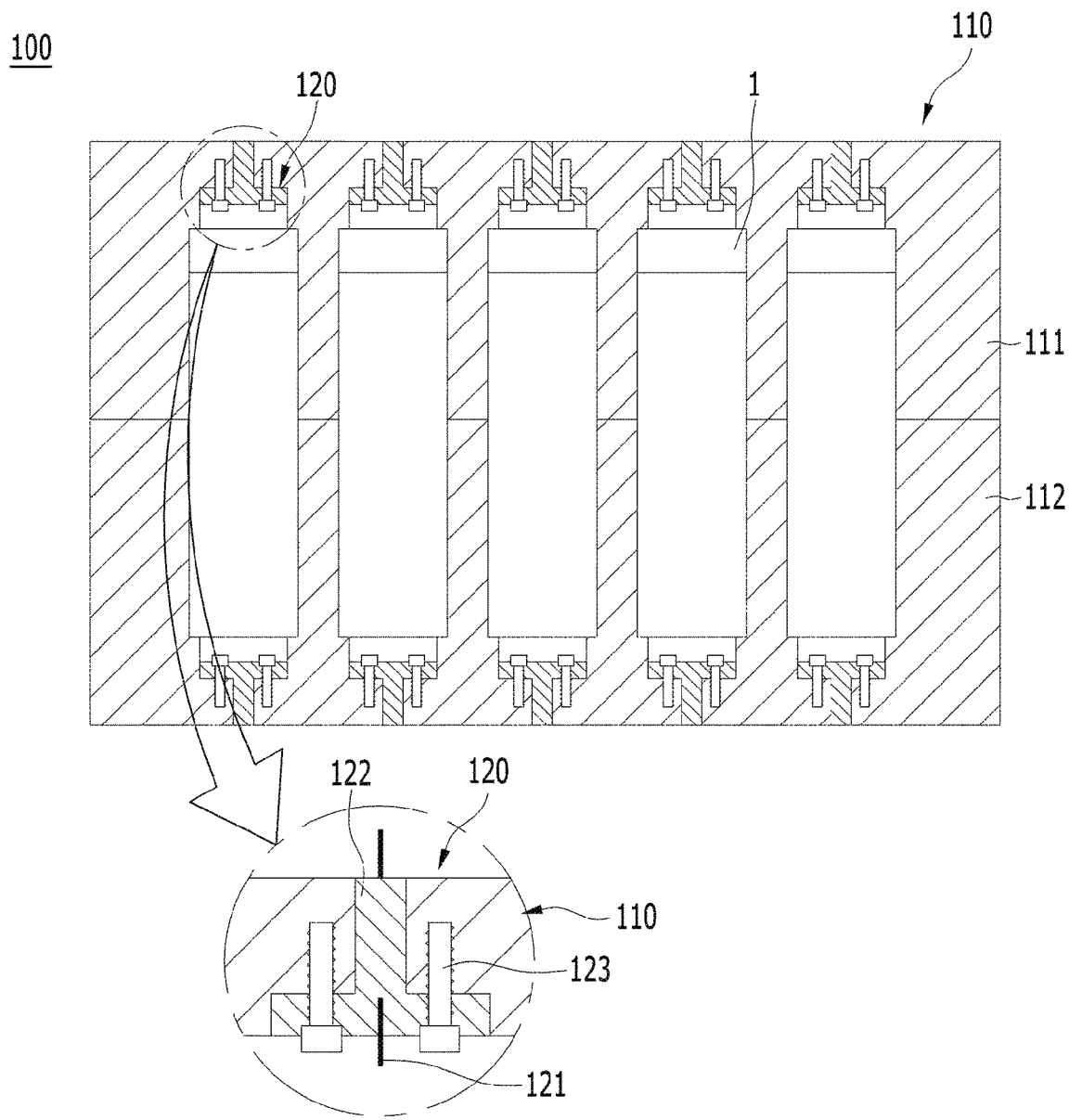

[FIG. 3]
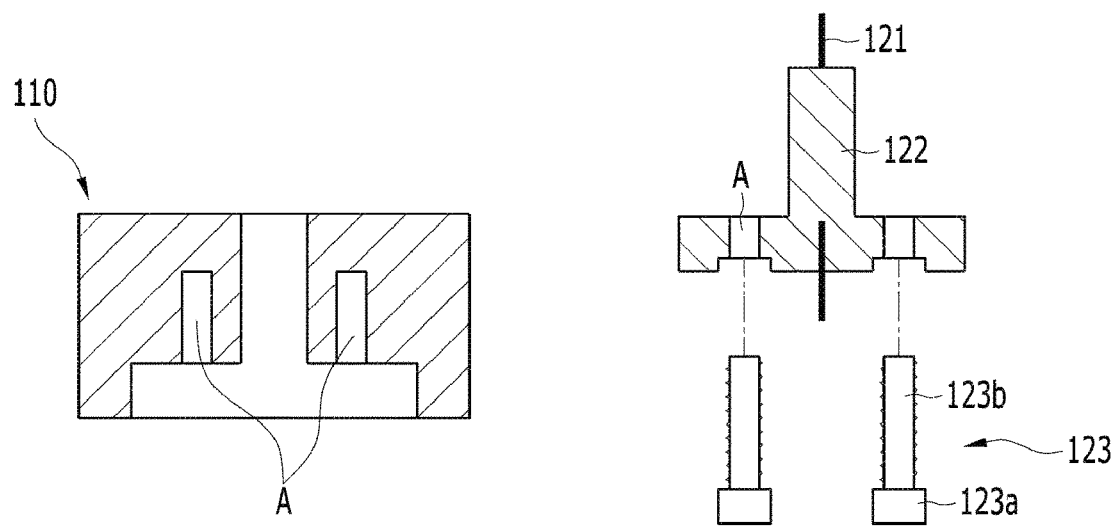
[FIG. 4]
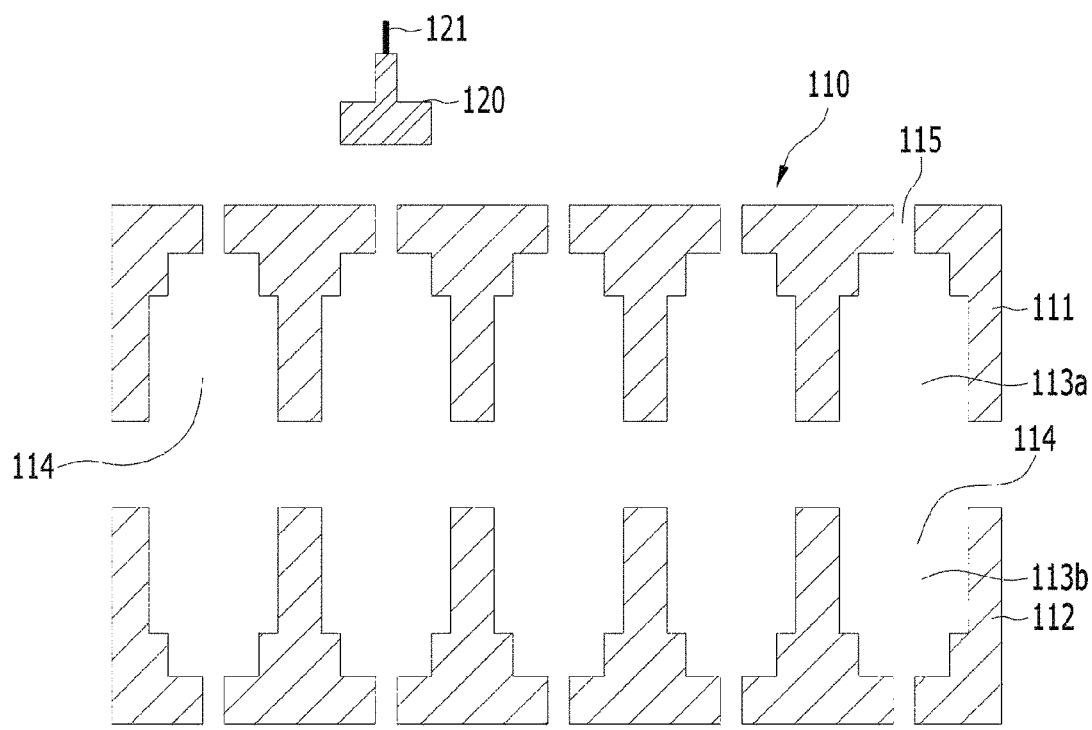

[FIG. 5]
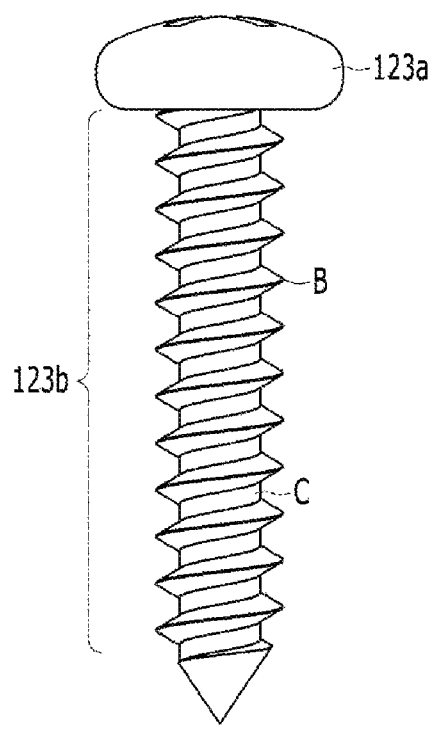

[FIG. 6]
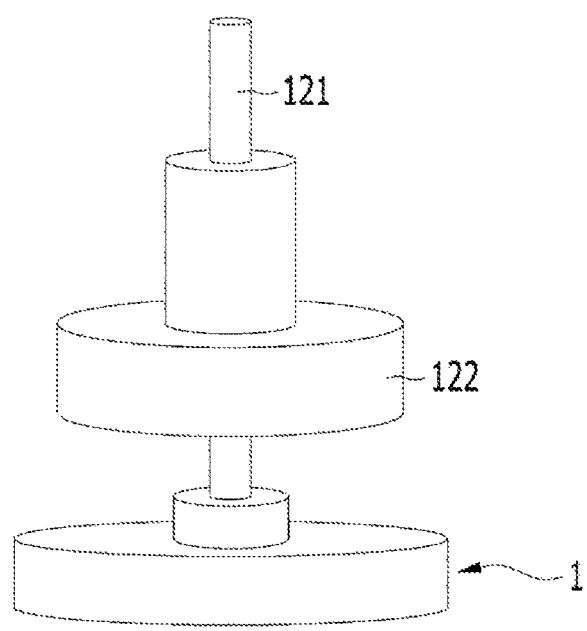

[FIG. 7]
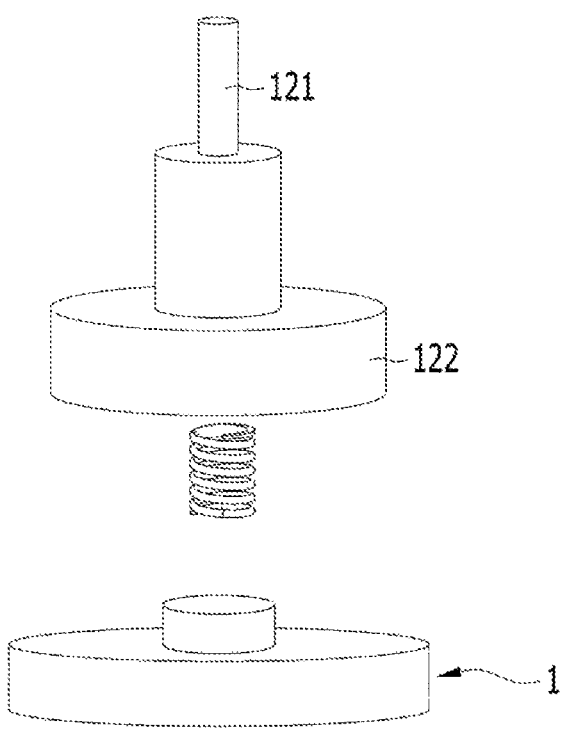

[FIG. 8]
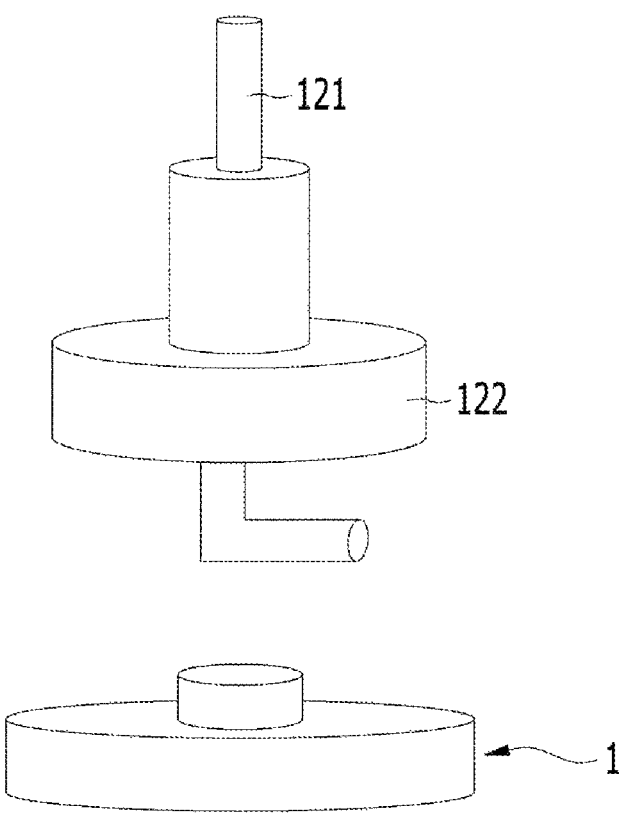

[FIG. 9]
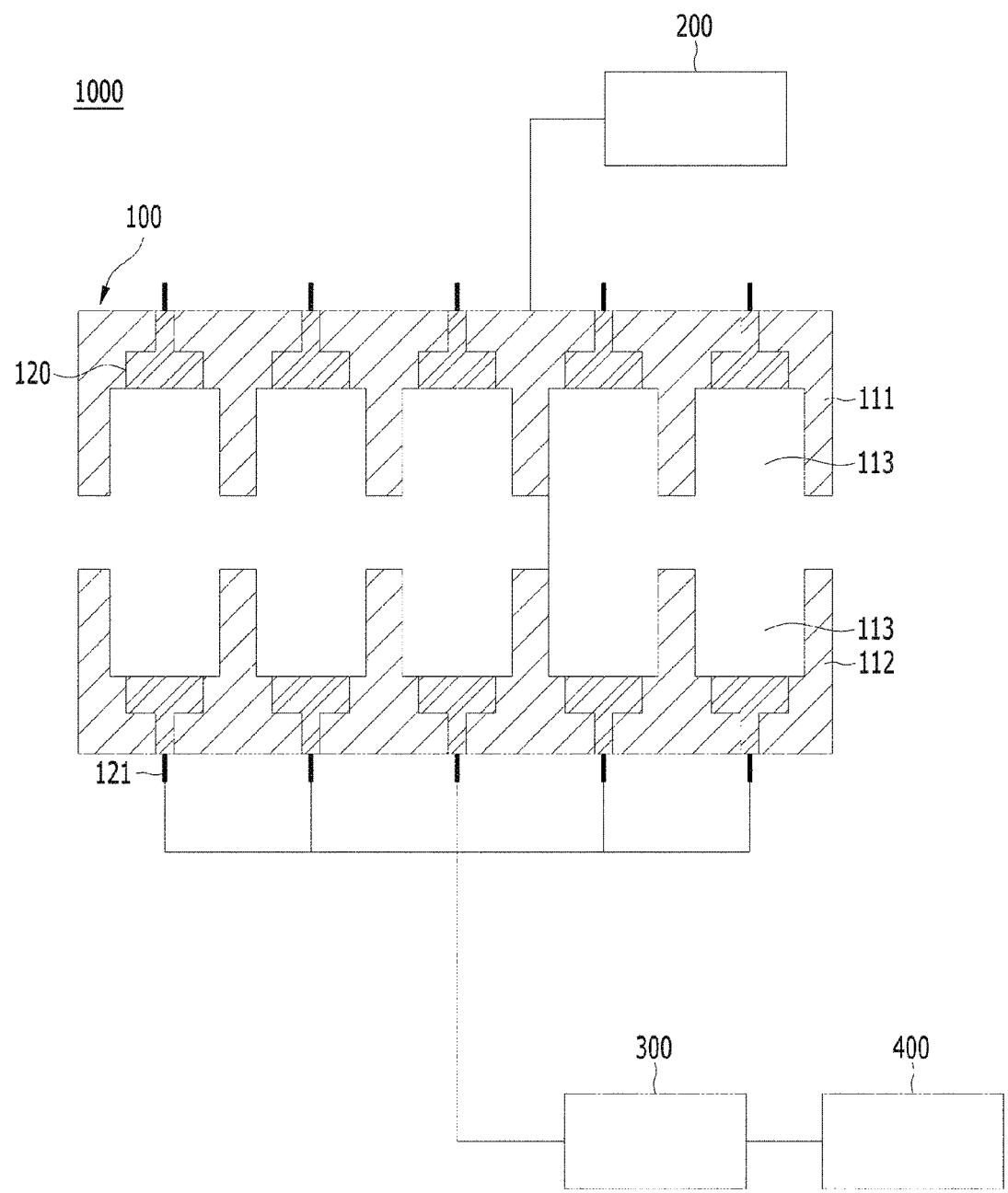

VIBRATION TEST JIG AND VIBRATION TEST APPARATUS FOR CYLINDRICAL BATTERY CELL

TECHNICAL FIELD

This application claims the benefit of priority based on Korean Patent Application No. 10-2019-0159566, filed on Dec. 4, 2019, and the entire contents of the Korean patent application are incorporated herein by reference.

The present invention relates to a vibration test jig and a vibration test apparatus capable of confirming a time point of disconnection of an electrode tab in real time during a vibration test of a cylindrical battery cell.

BACKGROUND ART

In recent years, as demand for portable electronic products such as notebook computers, video cameras, and portable telephones rapidly increases and electric vehicles, storage batteries for energy storage, robots, and satellites are developed, studies on high-performance secondary batteries capable of being recharged repeatedly have been actively performed.

The currently commercialized secondary rechargeable batteries include nickel-cadmium batteries, nickel-hydrogen batteries, nickel-zinc batteries, and lithium secondary batteries. Among them, the lithium secondary battery has a remarkable advantage over the nickel-based secondary battery because it has almost no memory effect, is free from charge and discharge, has very low self-discharge rate, and has high energy density.

In general, a secondary battery, unlike a primary battery that cannot be charged, means a battery that can be charged and discharged, and is widely used in electronic devices such as mobile phones, notebook computers, camcorders, or electric vehicles. In particular, the lithium secondary battery has a larger capacity than a nickel-cadmium battery or a nickel-hydrogen battery, and because the energy density per unit weight is high, the degree of utilization thereof is rapidly increasing.

The lithium secondary battery mainly uses a lithium-based oxide and a carbon material as a positive electrode active material and a negative electrode active material, respectively. The lithium secondary battery includes an electrode assembly, in which a positive electrode plate and a negative electrode plate coated with the positive electrode active material and the negative electrode active material, respectively, are disposed with a separator therebetween, and an exterior material that seals and stores the electrode assembly together with the electrolyte.

On the other hand, lithium secondary batteries are manufactured in various shapes such as cylindrical, square, and pouch types. An electrode assembly used in the cylindrical secondary battery includes an electrode assembly in the form of a jelly roll which is generated by inserting a separator sheet into a space between a positive electrode and a negative electrode formed by applying an active material to a current collector, followed by drying, roll-pressing and cutting, to thereby be wound.

In general, in a cylindrical secondary battery, a jelly roll in which a negative electrode sheet, a positive electrode sheet, and a separator sheet are wound in a circular shape is accommodated in a battery case, and in a square or pouch-type battery, the jelly roll, which is generated by winding the negative electrode sheet, the positive electrode sheet, and the separator sheet in an oval shape, is pressed and flattened, and then accommodated in the battery case.

Further, the positive electrode lead welded to the positive electrode current collector of the electrode assembly is electrically connected to the cap assembly and connected to the protruding terminal at the upper end of the top cap, and the negative electrode lead welded to the negative electrode current collector is welded to the sealed end of the case so that the case itself constitutes a negative electrode terminal. The material of the case is not particularly limited and can be formed of any one of stainless steel, steel, aluminum or equivalent thereof. In the state that the electrode assembly is accommodated in the case, the electrolyte solution is injected, and the cap assembly is mounted on the open end of the case to be sealed to thereby complete the assembly of the cylindrical secondary battery.

On the other hand, when the cylindrical secondary battery is transported, it is necessary to withstand the vibration characteristic coming from the outside or the vibration characteristic of the device in which the cylindrical secondary battery is mounted, so it is necessary to test such vibration characteristics. For this purpose, a vibration test jig is used, and FIG. 1 shows a conventional vibration test jig.

Referring to FIG. 1, a conventional vibration test jig 10 is composed of an upper jig and a lower jig, and each of the upper jig and the lower jig has a recessed groove capable of accommodating a cylindrical battery cell. As such, the conventional vibration test jig 10 is designed to perform a vibration test by accommodating the cylindrical battery cell 1 in the upper jig and the lower jig through the recess groove. However, in the conventional vibration test jig, after applying the vibration having a predetermined pattern, the voltage or resistance of the battery can be checked before/after the application of the vibration, but the electrical characteristics of the battery cell could not be confirmed during the application of the vibration. However, in the case of a new model, it is necessary to check the voltage/resistance data during the vibration test, so it is necessary to develop a technology for a vibration test jig and a vibration test apparatus that can monitor the condition of the battery cell in real time during the vibration test.

DISCLOSURE

Technical Problem

Accordingly, the present invention has been conceived to solve the above problems, and an object of the present invention is to provide a vibration test jig and a vibration test apparatus capable of monitoring the electrical characteristics of a battery cell in real time during a vibration test for a cylindrical battery cell.

Other objects and advantages of the present invention can be understood by the following description, and will be more clearly understood by the embodiments of the present invention. It will also be readily appreciated that the objects and advantages of the invention may be realized by the means and combinations thereof indicated in the claims.

Technical Solution

The present invention for achieving the above object provides an vibration test jig of a cylindrical battery cell, comprising: a main body configured to accommodate a cylindrical battery cell; and a connection unit configured to be electrically connected to an electrode terminal of the cylindrical battery cell, wherein the connection unit comprises: a connecting member configured to be electrically connected to the electrode terminal and be drawn out to an outside of the main body; a support member configured to support the connecting member; and a fixing member configured to allow the support member be fixed to the main body.

In an embodiment of the present invention, the connecting member is made of a conductive material, one end of the connecting member is connected to the electrode terminal, and the other end of the connecting member passes through the support member to thereby be drawn out to an outside of the main body.

In an embodiment of the present invention, one end of the fixing member is made to pass through the support member to be inserted into the main body, to thereby allow the support member to be coupled with the main body.

In an embodiment of the present invention, the fixing member includes a head unit and a column unit having a screw thread and a screw groove, and the support member and the main body have a coupling groove capable of insertion of the fixing member, respectively.

At this time, the support member is made to be coupled with the main body as the column unit of the fixing member passes through the support member and is inserted into the main body by rotation of the fixing member.

In an embodiment of the present invention, an interior of the coupling groove is provided with a screw thread coupled to a screw groove of the fixing member.

In an embodiment of the present invention, the main body includes a lower jig having a downward indentation portion of a size corresponding to that of a lower portion of the cylindrical battery cell, and a upper jig having an upward indentation portion of a size corresponding to that of an upper portion of the cylindrical battery cell, and the lower jig is coupled with the upper jig.

At this time, each of the upward indentation portion and the downward indentation portion includes a first opening into which the cylindrical battery cell is inserted and a second opening having a shape and size corresponding to an end of the connection unit in a direction in which the first opening is extended inward.

In an embodiment of the present invention, the connecting member includes a compression spring or a leaf spring.

In an embodiment of the present invention, one end of the connecting member is connected to an electrode terminal of the cylindrical battery, and the other end of the connecting member is connected to a voltage and resistance measuring instrument.

A vibration test apparatus of the present invention includes: the vibration test jig of the cylindrical battery cell; a vibration application unit configured to apply vibration to the vibration test jig; a voltage and resistance measuring instrument configured to be electrically connected to a plurality of cylindrical battery cells accommodated in the jig to measure voltages and resistances of the cylindrical battery cells; and a display unit configured to display values measured by the voltage and resistance measurement instrument.

A vibration test method for determining a time point of disconnection of an electrode tab by using the vibration test apparatus of the cylindrical battery cell according to the present invention includes: a step of accommodating a plurality of cylindrical battery cells in the vibration test jig; a step of drawing a connecting member electrically connected to an electrode terminal of the cylindrical battery cell to an outside of the vibration test jig to thereby be connected to a voltage and resistance measuring instrument; and a step of applying vibration to the vibration test jig, wherein in the step of applying the vibration to the vibration test jig, a voltage or resistance of the cylindrical battery cell vibrating in real time is measured.

The vibration test method according to an embodiment of the present invention may further include a step of determining a time point of disconnection of the electrode tab from the measured voltage or resistance value and storing information on the time point.

Advantageous Effects

Since the vibration test jig of the present invention can be electrically connected to an external voltage and resistance measuring instrument and a cylindrical battery cell mounted in the jig through a connection unit, it is possible to monitor the electrical state of the battery cell in real time during the vibration test, and there is an effect of being able to check whether or not the electrode tab is disconnected and the time point of the disconnection from the measured voltage or resistance value.

BRIEF DESCRIPTION OF THE DRAWINGS

FIG. 1 is a schematic diagram of a conventional vibration test jig.

FIG. 2 is a schematic diagram of a vibration test jig according to an embodiment of the present invention.

FIG. 3 is a detailed view of the connection unit constituting the vibration test jig of FIG. 2.

FIG. 4 is an exploded perspective view of the vibration test jig of FIG. 2.

FIG. 5 is a diagram illustrating a fixing member according to an embodiment of the present invention.

FIG. 6 is a diagram illustrating a state where a connection unit is electrically connected to an electrode terminal of a cylindrical battery cell according to an embodiment of the present invention.

FIG. 7 is a diagram illustrating a connecting member according to an embodiment of the present invention.

FIG. 8 is a diagram illustrating a connecting member according to another embodiment of the present invention.

FIG. 9 is a conceptual diagram of a vibration test apparatus according to an embodiment of the present invention.

DETAILED DESCRIPTION OF THE PREFERRED EMBODIMENTS

Hereinafter, preferred embodiments of the present invention will be described in detail with reference to the accompanying drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

Accordingly, the embodiments described in the specification and the configurations described in the drawings are only the most preferred embodiments of the present invention, and do not represent all of the technical ideas of the present invention. It is to be understood that there may be various equivalents and variations in place of them at the time of filing the present application.

Also, throughout the specification, when an element is referred to as "including" an element, it is understood that the element may include other elements as well unless specifically stated otherwise.

FIG. 2 is a schematic diagram of a vibration test jig according to an embodiment of the present invention, and FIG. 3 is a detailed view of the connection unit constituting the vibration test jig of FIG. 2. Referring to these drawings, a vibration test jig 100 of a cylindrical battery cell according to the present invention includes: a main body 110 configured to accommodate a cylindrical battery cell; and a connection unit 120 configured to be electrically connected to an electrode terminal of the cylindrical battery cell, wherein the connection unit includes: a connecting member 121 configured to be electrically connected to the electrode terminal and be drawn out to an outside of the main body; a support member 122 configured to support the connecting member; and a fixing member 123 configured to allow the support member be fixed to the main body.

In the vibration test jig of the present invention, when performing the vibration test, in some battery cells, disconnection of the electrode tab may occur due to the shock caused by vibration. The vibration test jig is a jig designed to check the time point of disconnection of the electrode tab by measuring the resistance or voltage value of the battery cell under vibration test in real time.

Referring to FIGS. 2 and 3, one end of the connecting member 121 is connected to the electrode terminal, and the other end of the connecting member 121 passes through the support member 122 to thereby be drawn out to an outside of the main body 110.

Further, one end of the fixing member 123 is made to pass through the support member 122 to be inserted into the main body 110, to thereby allow the support member 122 to be coupled with the main body 110. Specifically, the fixing member 123 includes a head unit 123a and a column unit 123b having a screw thread and a screw groove, and the support member 122 and the main body 110 have a coupling groove A capable of insertion of the fixing member 123, respectively. At this time, the support member 122 may be made to be coupled with the main body 110 as the column unit of the fixing member 123 passes through the support member 122 and is inserted into the main body 110 by rotation of the fixing member 123. Even though not illustrated in the drawing, the inner surface of the coupling groove A is provided with a screw thread and a screw groove that can be coupled with the screw thread and the screw groove of the column unit 123b of the fixing member 123, and the screw thread and screw groove are in the diagonal direction so that by the rotation of the fixing member 123, the column unit 123b of the fixing member can penetrate the support member 122 and be inserted into the coupling groove A of the main body 110.

FIG. 4 is an exploded perspective view of the vibration test jig of FIG. 2. Referring to FIG. 4, the main body 110 constituting the vibration test jig of the present invention includes a lower jig 112 having a downward indentation portion 113b of a size corresponding to that of a lower portion of the cylindrical battery cell, and a upper jig 111 having an upward indentation portion 113a of a size corresponding to that of an upper portion of the cylindrical battery cell, and the lower jig 112 is detachably coupled with the upper jig 111. Here, the detachably coupled structure means that in a state in which the upper jig and the lower jig are separated, the cylindrical battery cell is accommodated in the jig, and then the upper jig and the lower jig are coupled to each other, so that the cylindrical battery cell is isolated from the outside.

Further, each of the upward indentation portion 113a and the downward indentation portion 113b may include a first opening 114 into which the cylindrical battery cell is inserted so that the cylindrical battery cell may be accommodated in the upper jig 111 and the lower jig 112 through the first opening 114. Further, each of the upward indentation portion 113a and the downward indentation portion 113b includes a second opening 115 having a shape and size corresponding to an end of the connection unit 120 in a direction in which the first opening 114 is extended inward, so that the connection unit 120 electrically connected to the cylindrical battery cell is inserted through the second opening 115 to be fixed to the main body 110, thereby allowing the connecting member 121 to be drawn out to an outside through the second opening 115.

FIG. 6 shows an embodiment of a connecting member 121 constituting the connection unit of the present invention. Referring to FIG. 6, the connecting member 121 passes through the support member 122 and is supported by the support member 122, one end of the connecting member 121 is drawn out of the main body, and the other end thereof is in physical contact with the electrode terminal of the cylindrical battery cell 1. And since one end of the connecting member drawn to the outside is connected to the voltage and resistance measuring instrument, it is possible to measure the voltage and/or resistance of the cylindrical battery cell in real time through the connecting member electrically connected to the cylindrical battery cell even during the vibration test.

Since the material of the connecting member of the present invention is for electrical connection, it is not limited to that kind if the connecting member is made of a conductive material.

FIG. 7 is a diagram illustrating a connecting member 121 according to another embodiment of the present invention. Referring to FIG. 7, one end of the connecting member 121 is drawn to the outside of the main body, and the other end portion in contact with the electrode terminal of the cylindrical battery cell is formed of a compressed spring shape. When the other end of the connecting member is a compression spring, there is an effect of preventing a connection failure between the connecting member and the electrode terminal due to impact caused by vibration application of the vibration test jig.

FIG. 8 is a diagram illustrating a connecting member according to another embodiment of the present invention. Referring to FIG. 8, one end of the connecting member 121 is drawn to the outside of the main body, and the other end portion in contact with the electrode terminal is formed of a plate spring shape. By configuring a portion of the connecting member in contact with the electrode terminal in the form of a leaf spring, the connecting member has the effect of stably grounding the electrode terminal even in an impact caused by vibration.

Hereinafter, the vibration test apparatus of the present invention will be described in detail.

FIG. 9 is a conceptual diagram of the vibration test apparatus of the present invention. Referring to FIG. 9, a vibration test apparatus 1000 includes the vibration test jig 100 of the cylindrical battery cell; a vibration application unit 200 configured to apply vibration to the vibration test jig; a voltage and resistance measuring instrument 300 configured to be electrically connected to a plurality of battery cells accommodated in the jig to measure voltages and resistances of the battery cells; and a display unit 400 configured to display values measured by the voltage and resistance measurement instrument.

The vibration application unit 200 applies vibration to the vibration test jig 100 of the present invention. The vibration application unit is not limited if the vibration of the pattern specified in the vibration test jig can be applied.

The vibration application unit according to an embodiment of the present invention may include at least one vibrating body and a protective case. The vibrating body is configured to generate vibration using electrical energy. The protective case accommodates at least one vibrating body in its inner space. The vibration application unit may be fixed to a part of the vibration test jig. The vibration application unit generates a vibration having a predetermined pattern in a state fixed to the vibration test jig through its upper surface. Specifically, the vibration application unit is vibrated in a regular or irregular pattern along at least one of the width direction, length direction, and height direction of the cylindrical battery cell housed in the vibration test jig. At this time, the pattern of the vibration, which is generated in the vibration application unit, may be based on the data collected in advance using the means of transportation, in which cylindrical battery cells are transported, or vibration sensors mounted on the device of the cylindrical battery cells.

The voltage and resistance measurement instrument 300 is connected to the cylindrical battery cell through the connecting member, and measures the voltage and/or resistance of the cylindrical battery cell in real time while vibration is applied. During the vibration test, if the electrode tab of the cylindrical battery cell is disconnected due to shock caused by vibration, there is a change in voltage and/or resistance, and thus it is possible to check whether the disconnection has occurred and the time point of disconnection from the measured voltage and/or resistance values in real time.

The display unit 400 outputs a voltage and a resistance measured by the voltage and resistance measuring instrument.

Hereinafter, the vibration test method of the present invention will be described in detail.

The vibration test method of the present invention shows an effect of checking whether or not the electrode tab is disconnected and the time point of disconnection in real time during a vibration test using the vibration test jig and the vibration test apparatus described above. The vibration test method of the present invention includes: a step (S100) of accommodating a plurality of cylindrical battery cells in the vibration test jig; a step (S200) of drawing a connecting member electrically connected to an electrode terminal of the cylindrical battery cell to an outside of the vibration test jig to thereby be connected to a voltage and resistance measuring instrument; and a step (S300) of applying vibration to the vibration test jig, wherein in the step (S300) of applying the vibration, a voltage or resistance of the cylindrical battery cell vibrating in real time is measured.

The step of accommodating the cylindrical battery cell is a step of accommodating the cylindrical battery cell in the vibration test jig. Referring to FIGS. 2 and 3, the vibration test jig 100 includes: a main body 110 configured to accommodate a cylindrical battery cell; and a connection unit 120 configured to be electrically connected to an electrode terminal of the cylindrical battery cell, wherein the connection unit includes: a connecting member 121 configured to be electrically connected to the electrode terminal and be drawn out to an outside of the main body; a support member 122 configured to support the connecting member; and a fixing member 123 configured to allow the support member be fixed to the main body. As shown in FIG. 4, the main body 110 includes a lower jig 112 having a downward indentation portion 113b of a size corresponding to that of a lower portion of the cylindrical battery cell, and a upper jig 111 having an upward indentation portion 113a of a size corresponding to that of an upper portion of the cylindrical battery cell, and the lower jig 112 is detachably coupled with the upper jig 111. The cylindrical battery cell is accommodated in the upper jig and the lower jig through the upward indentation portion and the downward indentation portion, and the upper jig and the lower jig are coupled to each other to thereby isolate the cylindrical battery cell from the outside of the jig. At this time, the electrode terminal of the cylindrical battery cell should be stored in contact with the connecting member 121 of the connection unit 120.

Thereafter, the connecting member 121 being drawn out to the outside of the vibration test jig is connected to the voltage and resistance measuring instrument 300. The electrical connection with the connecting member and the voltage and resistance measuring instrument is made by a known method.

Thereafter, the vibration application unit 300 coupled with a part of the vibration test jig is operated to apply a predetermined pattern of vibration to the vibration test jig, thereby performing a vibration test. Cylindrical battery cells in the jig are vibrated by the application of vibration with a constant amplitude and frequency, and in the case of a cylindrical battery cell having defective electrode tabs or a poor welding problem, the electrode tab may be disconnected. The vibration test method of the present invention measures voltage or/and resistance of a cylindrical battery cell in real time during application of vibration, and determines whether an electrode tab is disconnected or a time point of when the electrode tab is disconnected based on the measured voltage and/or resistance value. Further, the vibration test method of the present invention further includes a step of determining a time point of disconnection of the electrode tab from the measured voltage or resistance value and storing information on the time point, thereby exhibiting an effect of being able to individually convert time points of disconnection of electrode tabs due to vibration into data for a plurality of cylindrical battery cells.

The invention claimed is:

1. A vibration test jig of a cylindrical battery cell, comprising:
    a main body configured to accommodate a cylindrical battery cell; and
    a connection unit electrically connected to an electrode terminal of the cylindrical battery cell,
    wherein the connection unit comprises:
    a connecting member electrically connected to the electrode terminal and to be drawn out to an outside of the main body;
    a support member configured to support the connecting member;
    a fixing member configured to allow the support member to be fixed to the main body; and
    one end of the fixing member passes through the support member to be inserted into the main body, thereby allow the support member to be coupled with the main body.

2. The vibration test jig of claim 1, wherein the connecting member includes a conductive material, one end of the connecting member is connected to the electrode terminal, and the other end of the connecting member passes through the support member to thereby be drawn out to the outside of the main body.

3. The vibration test jig of claim 1, wherein the fixing member includes a head unit and a column unit having a screw thread and a screw groove, and wherein the support member and the main body have a coupling groove capable of insertion of the fixing member, respectively.

4. The vibration test jig of claim 3, wherein the support member couples with the main body as the column unit of the fixing member passes through the support member and inserts into the main body by rotation of the fixing member.

5. The vibration test jig of claim 3, wherein an interior of the coupling groove includes a screw thread coupled to a screw groove of the fixing member.

6. The vibration test jig of claim 1, wherein the main body includes a lower jig having a downward indentation portion of a size corresponding to that of a lower portion of the cylindrical battery cell, and an upper jig having an upward indentation portion of a size corresponding to that of an upper portion of the cylindrical battery cell, and
wherein the lower jig is coupled with the upper jig.

7. The vibration test jig of claim 6, wherein each of the upward indentation portion and the downward indentation portion includes a first opening into which the cylindrical battery cell is inserted and a second opening having a shape and size corresponding to an end of the connection unit in a direction in which the first opening is extended inward.

8. The vibration test jig of claim 1, wherein the connecting member comprises a compression spring or a leaf spring.

9. The vibration test jig of claim 1, wherein one end of the connecting member is connected to an electrode terminal of the cylindrical battery, and the other end of the connecting member is connected to a voltage and resistance measuring instrument.

10. A vibration test apparatus of a cylindrical battery cell, the vibration test apparatus comprising:
the vibration test jig of claim 1;
a vibration application unit to apply vibration to the vibration test jig;
a voltage and resistance measuring instrument to be electrically connected to a plurality of cylindrical battery cells accommodated in the vibration test jig to measure voltages and resistances of the plurality of cylindrical battery cells; and
a display unit to display values measured by the voltage and resistance measuring instrument.

11. A vibration test method for determining a time point of disconnection of an electrode tab by using the vibration test apparatus of claim 10, the vibration test method comprising:
a step of accommodating a plurality of cylindrical battery cells in the vibration test jig;
a step of drawing a connecting member electrically connected to an electrode terminal of at least one of the plurality of cylindrical battery cells to an outside of the vibration test jig to thereby be connected to a voltage and resistance measuring instrument; and
a step of applying vibration to the vibration test jig,
wherein the step of applying the vibration to the vibration test jig includes measuring a voltage or resistance of the at least one of the plurality of cylindrical battery cell vibrating in real time.

* * * * *